(12) United States Patent
Kitajima (10) Patent No.: US 10,326,489 B2
(45) Date of Patent: Jun. 18, 2019

(54) CIRCUIT MODULE (71) Applicant: Murata Manufacturing Co., Ltd., Nagaokakyo-shi, Kyoto-fu (JP)

(72) Inventor: Hiromichi Kitajima, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 842 days.

(21) Appl. No.: 14/100,103

(22) Filed: Dec. 9, 2013

(65) Prior Publication Data
US 2014/0179364 A1 Jun. 26, 2014

Related U.S. Application Data (63) Continuation of application No. PCT/JP2012/003842, filed on Jun. 13, 2012.

(30) Foreign Application Priority Data

Jun. 21, 2011 (JP) ................................. 2011-136992

(51) Int. Cl.
H04B 1/40 (2015.01)
H04B 1/525 (2015.01)
(Continued)

(52) U.S. Cl.
CPC ................ H04B 1/40 (2013.01); H01P 3/08 (2013.01); H03H 7/0138 (2013.01); H04B 1/525 (2013.01); H03H 9/0566 (2013.01)

(58) Field of Classification Search
CPC combination set(s) only.
See application file for complete search history.

(56) References Cited

U.S. PATENT DOCUMENTS

2003/0169571 A1  9/2003 Kimura
2004/0032706 A1* 2/2004 Kemmochi ............ H03H 7/465
                                                    361/306.3
(Continued)

FOREIGN PATENT DOCUMENTS

DE  10 2005 032 058 A1  1/2007
JP       11-251587 A    9/1999
(Continued)

OTHER PUBLICATIONS

Official Communication issued in corresponding German Patent Application No. 11 2012 002 565.2, dated Apr. 17, 2014.
(Continued)

Primary Examiner — Zhitong Chen
(74) Attorney, Agent, or Firm — Keating & Bennett, LLP (57) ABSTRACT In a circuit module, even if a transmission signal output from a transmission electrode of a mounting substrate to a transmission terminal of a splitter leaks into a ground electrode, the transmission signal that has leaked into the ground electrode is mainly transmitted along an edge of the ground electrode and the transmission signal that has leaked into the ground electrode flows into a plurality of via conductors arranged with end surfaces superposed with the edge of the ground electrode when viewed in plan. Therefore, a transmission signal that has been output from the transmission electrode and leaked into the ground electrode is prevented from traveling along the edge of the ground electrode toward the reception electrode side. As a result, isolation characteristics of the transmission electrode and the reception electrode from each other are improved.

19 Claims, 5 Drawing Sheets (51) Int. Cl.
*H03H 9/05* (2006.01)
*H01P 3/08* (2006.01)
*H03H 7/01* (2006.01)

(56) References Cited

U.S. PATENT DOCUMENTS

| | | | |
|---|---|---|---|
| 2007/0026676 A1 | 2/2007 | Li et al. | |
| 2007/0247258 A1* | 10/2007 | Nagano | H01L 23/15 333/133 |
| 2009/0302970 A1* | 12/2009 | Hatano | H03H 9/0571 333/133 |
| 2010/0127799 A1 | 5/2010 | Bauer et al. | |
| 2010/0319975 A1 | 12/2010 | Tsutsumi et al. | |

FOREIGN PATENT DOCUMENTS

| | | |
|---|---|---|
| JP | 2002-094204 A | 3/2002 |
| JP | 2003-198419 A | 7/2003 |
| JP | 2003-309403 A | 10/2003 |
| JP | 2006-279604 A | 10/2006 |
| JP | 2007-151123 A | 6/2007 |
| JP | 2009-225198 A | 10/2009 |
| JP | 2009-296508 A | 12/2009 |
| JP | 2010-220231 A | 9/2010 |
| WO | 2005/107068 A1 | 11/2005 |
| WO | 2007/016557 A2 | 2/2007 |

OTHER PUBLICATIONS

Official Communication issued in International Patent Application No. PCT/JP2012/003842, dated Aug. 7, 2012.

* cited by examiner

CIRCUIT MODULE

BACKGROUND OF THE INVENTION

1. Field of the Invention

The present invention relates to circuit modules that include a mounting substrate provided with a plurality of signal electrodes, a ground electrode arranged between the signal electrodes when viewed in plan and a plurality of via conductors connected to the ground electrode.

2. Description of the Related Art

In recent years, mobile communication terminals such as cellular phones and mobile information terminals that support communication using a plurality of communication standards such as the global system for mobile communications (GSM) standard and the code division multiple access (CDMA) standard have rapidly become widespread, and in such mobile communication terminals, transmission and reception of signals of different frequency bands are performed using a common antenna. Therefore, there have been growing demands for further increases in the performance of and reductions in the size of front end modules (circuit modules) such as antenna switches including a splitter (duplexer) that separates a transmission signal and a reception signal having different frequencies.

Figure 9:
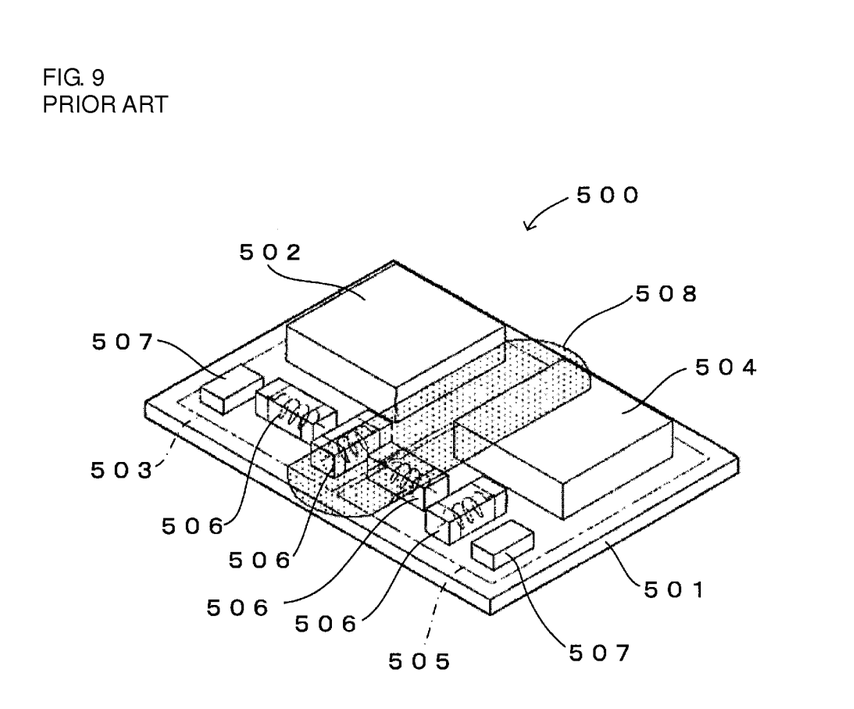
FIG. 9 illustrates an example of a splitter of the related art.

For example, as illustrated in FIG. 9, a splitter 500, which has a reduced size and increased performance as a result of having first and second filter units 503 and 505 thereof having different signal pass bands arranged close to each other in such a manner that the characteristics of the filter units 503 and 505 are not degraded, is mounted on a mounting substrate to be included in a circuit module, and as a result, the circuit module can be reduced in size and increased in performance. The splitter 500 of the related art illustrated in FIG. 9 includes the first filter unit 503, which includes a surface acoustic wave (SAW) filter device 502, and the second filter unit 505, which includes a SAW filter device 504, on a mounting surface of a base substrate 501 composed of a resin, a ceramic or a polymer material, such as a printed substrate, an LTCC substrate, an alumina-based substrate, a glass substrate or a composite material substrate, and the first and second filter units 503 and 505 are each provided with passive devices such as chip inductors 506 and chip capacitors 507 that serve as peripheral circuit devices that complement the electrical characteristics of the SAW filter devices 502 and 504.

In order to suppress electromagnetic interference between the inductor devices and prevent signal interference between the filter units 503 and 505, the chip inductors 506, which are adjacent to each other in a boundary portion 508 between the first filter unit 503 and the second filter unit 505, are arranged on the base substrate 501 such that their magnetic flux directions are substantially orthogonal to each other. By adopting this configuration, even when the filter units 503 and 505 are arranged close to each other, signal interference between the first and second filter units 503 and 505 is prevented and changes in the characteristics of the filter units 503 and 505 are reduced.

The splitter 500 of the related art, for which a reduction in size and an increase in performance have been achieved in this way, is mounted on a mounting substrate and the first and second filter units 503 and 505 of the splitter 500 are respectively utilized as a transmission filter and a reception filter and thereby a circuit module such as an antenna switch is formed.

In addition, the splitter 500 has a transmission terminal for allowing input of a transmission signal from the mounting substrate side to the transmission filter, a reception terminal for allowing output of a reception signal from the reception filter to the mounting substrate side, an antenna terminal (common terminal) that is connected to the output side of the transmission filter and the input side of the reception filter, and a ground terminal. The mounting substrate is provided with a transmission electrode and a reception electrode, which are respectively connected to the transmission terminal and the reception terminal of the splitter 500. Then, a transmission signal is output via the transmission terminal to the transmission filter included in the splitter 500 from the transmission electrode of the mounting substrate and the transmission signal input to the transmission filter is subjected to predetermined filter processing and is then output from the antenna terminal of the splitter 500. In addition, a reception signal is input to the reception filter included in the splitter 500 from the antenna terminal and the reception signal input to the reception filter is subjected to predetermined filter processing and is then output to the mounting substrate side via the reception electrode from the reception terminal of the splitter 500.

There is a risk of a transmission signal, which has been output to the transmission terminal of the splitter 500 from the transmission electrode of the mounting substrate in order to input a transmission signal to the transmission filter, leaking toward the reception electrode, which is provided in the mounting substrate and is for allowing input of a reception signal, and interfering with a reception signal input from the antenna terminal and output to the reception electrode of the mounting substrate from the reception terminal via the reception filter. Therefore, in general, in order to prevent a transmission signal output to the transmission terminal of the splitter 500 from the transmission electrode of the mounting substrate from interfering with a reception signal input from the antenna terminal and output to the reception electrode of the mounting substrate from the reception terminal of the splitter 500 via the reception filter, a ground electrode, which is connected to the ground terminal of the splitter 500, is provided between the transmission electrode and the reception electrode on the mounting substrate.

In recent years, size reduction of mobile communication terminals has been rapidly progressing and there is a demand for further size reduction of a circuit module mounted in such a mobile communication terminal and of the splitter 500 mounted in the circuit module. However, if the splitter 500 is further reduced in size, the space between the transmission terminal, which is for allowing input to the transmission filter, and the reception terminal, which is for allowing output from the reception filter, of the splitter 500 becomes extremely small, and therefore, even though the ground electrode, which is connected to the ground terminal of the splitter 500, is provided between the transmission electrode and the reception electrode provided in the mounting substrate on which the splitter 500 is mounted, there is a risk of a transmission signal output to the transmission terminal of the splitter 500 from the transmission electrode of the mounting substrate leaking into the ground electrode and of the transmission signal that has leaked into the ground electrode traveling along an edge portion of the ground electrode toward the reception electrode side and interfering with a reception signal output to the reception electrode of the mounting substrate from the reception terminal of the splitter 500 via the reception filter, which is an obstacle to size reduction of the splitter 500.

SUMMARY OF THE INVENTION

Accordingly, preferred embodiments of the present invention provide a technology that improves characteristics of isolation of a plurality of signal electrodes, which are provided in a mounting substrate, from each other.

A circuit module according to a preferred embodiment of the present invention includes a mounting substrate that is provided with a plurality of signal electrodes, a ground electrode that is arranged between the signal electrodes when viewed in plan and isolated from the signal electrodes, and a plurality of via conductors that are connected to the ground electrode, each via conductor being arranged so that an edge of the ground electrode is superposed with at least a portion of an end surface of the via conductor when viewed in plan.

In addition, the edge of the ground electrode preferably includes a bent portion. By adopting this structure, the ground electrode has an optimal configuration between the plurality of signal electrodes provided in the mounting substrate, which is practical.

In addition, a portion of an end surface of a via conductor arranged at the bent portion of the edge of the ground electrode preferably has the same shape as a portion of the bent portion. By adopting this structure, a signal that has leaked from a signal electrode into the ground electrode is more efficiently prevented from traveling along an edge of the ground electrode toward another signal electrode and therefore characteristics of isolation of the plurality of signal electrodes, which are provided in the mounting substrate, from each other are further improved.

In addition, each bent portion of the edge of the ground electrode may have a circular or substantially circular arc shape, for example. By adopting this structure, concentration of a signal, which has leaked from any of the plurality of signal electrodes into the ground electrode, in a bent portion of the edge of the ground electrode is effectively reduced.

In addition, it is preferable that the via conductor provided at the bent portion of the edge of the ground electrode have a diameter larger than that of another via conductor arranged at a location other than a location of the bent portion. By adopting this structure, a signal that has leaked from a signal electrode into the ground electrode and is concentrated in a bent portion efficiently flows into the via conductor arranged at the bent portion and as a result the signal that leaked into the ground electrode is more efficiently prevented from traveling along the edge of the ground electrode toward another signal electrode and therefore the characteristics of isolation of the plurality of signal electrodes, which are provided in the mounting substrate, from each other are further improved.

In addition, it is preferable that a plurality of via conductors be further arranged at positions other than along the edge of the ground electrode, and that each via conductor arranged so that its end surface is superposed with the edge of the ground electrode have a diameter that is larger than a diameter of each via conductor arranged at positions other than along the edge of the ground electrode. By adopting this structure, a signal that has leaked into the ground electrode from any of the plurality of signal electrodes readily flows into a large-diameter via conductor and is prevented from traveling along the edge of the ground electrode toward another signal electrode.

In addition, a splitter including a transmission filter and a reception filter having different pass bands may be mounted on the mounting substrate, the splitter including a transmission terminal that allows input to the transmission filter, a reception terminal that allows output from the reception filter, and a ground terminal, a transmission electrode that is connected to the transmission terminal and a reception electrode that is connected to the reception terminal being provided as the signal electrodes in the mounting substrate, and the ground electrode being arranged between the transmission electrode and the reception electrode when viewed in plan and connected to the ground terminal. By adopting this structure, a transmission signal that has been output from the transmission electrode and leaked into the ground electrode is prevented from traveling along the edge of the ground electrode toward the reception electrode side and as a result characteristics of isolation of the transmission electrode and the reception electrode, which are provided in the mounting substrate on which the splitter is mounted, from each other are improved.

In addition, the ground electrode may be provided in layers in the mounting substrate and the layers of the ground electrode may be electrically connected to each other. By adopting this structure, a transmission signal that has leaked into the ground electrode is more efficiently prevented from traveling along an edge of the ground electrode toward another signal electrode and characteristics of isolation of the plurality of signal electrodes, which are provided in the mounting substrate, from each other are further improved.

According to various preferred embodiments of the present invention, a signal that has leaked into a ground electrode from any of a plurality of signal electrodes is prevented from traveling along an edge of the ground electrode toward another signal electrode and therefore the characteristics of isolation of the plurality of signal electrodes, which are provided in a mounting substrate, from each other are improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
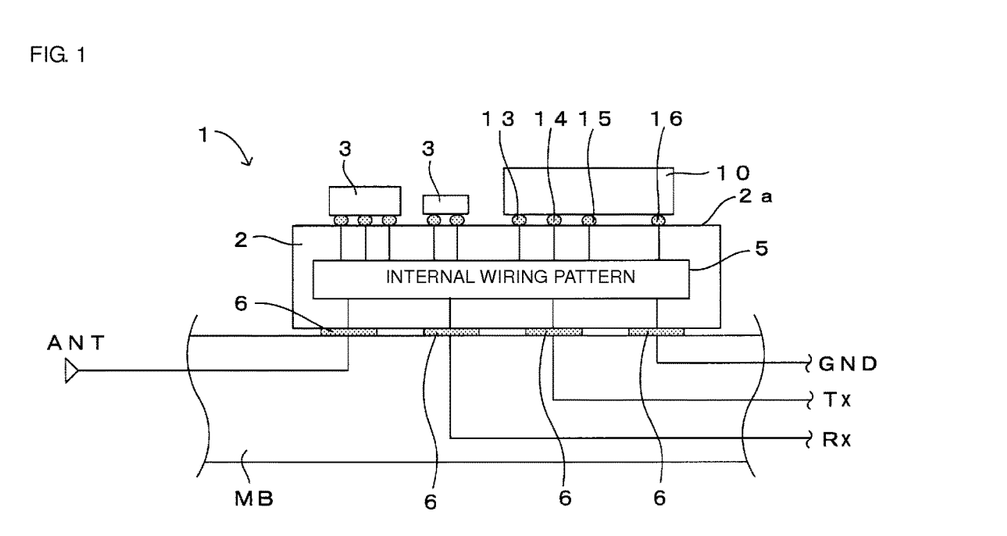
FIG. 1 illustrates a first preferred embodiment of a circuit module of the present invention.
Figure 2:
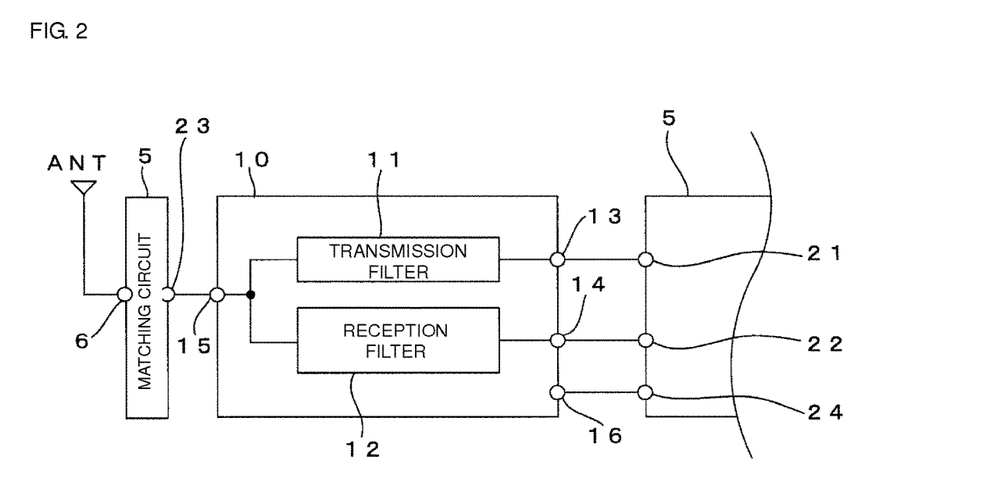
FIG. 2 is a block diagram illustrating the internal configuration of the circuit module of FIG. 1.
Figure 3:
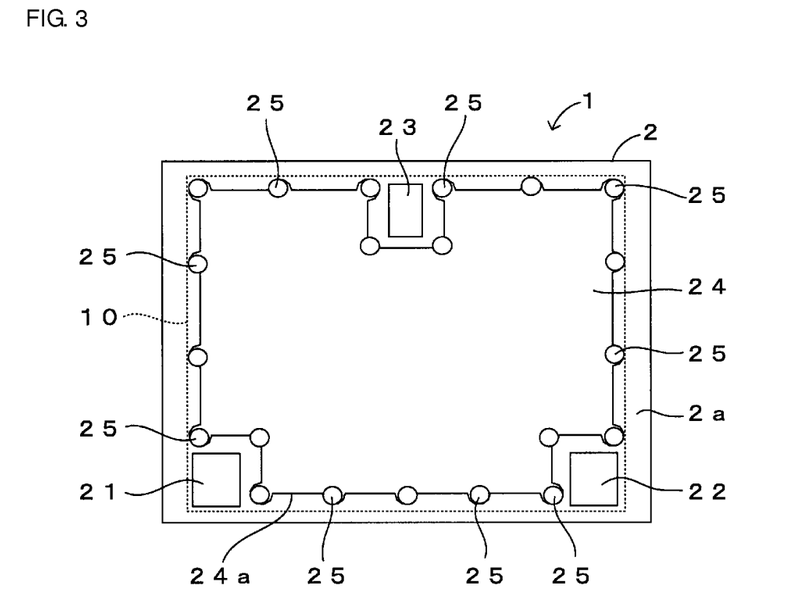
FIG. 3 is a plan view illustrating an example of the shapes of electrodes of a mounting substrate of the circuit module of FIG. 1.
Figure 4:
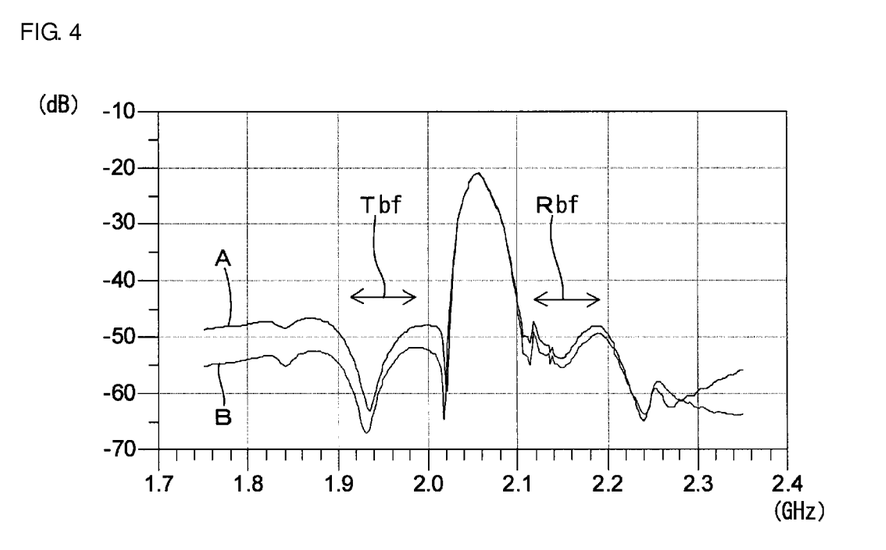
FIG. 4 illustrates an example of isolation characteristics for the mounting substrate of FIG. 3.

Description will be given of a first preferred embodiment of a circuit module that includes a splitter (duplexer) of the present invention while referring to FIGS. 1 to 4. FIG. 1 illustrates the first preferred embodiment of the circuit module of the present invention. FIG. 2 is a block diagram illustrating the internal configuration of the circuit module of FIG. 1. FIG. 3 is a plan view illustrating an example of the shapes of electrodes of a mounting substrate of the circuit module of FIG. 1. FIG. 4 illustrates an example of isolation characteristics for the mounting substrate of FIG. 3.

A circuit module 1 illustrated in FIG. 1 is mounted on a motherboard MB included in a mobile communication terminal such as a cellular phone or a mobile information terminal, and, in this preferred embodiment, includes a mounting substrate 2, a splitter 10, and various components 3 such as a switch IC, a filter, a resistor, a capacitor and a coil, and defines as a high-frequency antenna switch module, for example. In addition, the splitter 10 and the components 3 are mounted on electrodes provided on a mounting surface 2a of the mounting substrate 2 and are electrically connected to a plurality of mounting electrodes 6 located on a back surface of the mounting substrate 2 via an internal wiring pattern 5 provided inside the mounting substrate 2. The circuit module 1 is mounted on the motherboard MB, such that the circuit module 1 is connected to various signal lines such as an antenna line ANT, a ground line GND, a transmission signal line Tx and a reception signal line Rx, and a power supply line that the motherboard MB is equipped with, and input and output of transmission and reception signals between the motherboard MB and the circuit module 1 is performed.

The mounting substrate 2, in this preferred embodiment, preferably is an integrated ceramic multilayer body including a plurality of dielectric layers defined by ceramic green sheets and stacked on top of one another and then fired. The internal wiring pattern 5 is preferably defined by via conductors and electrode patterns provided in and on the dielectric layers.

That is, the ceramic green sheets that define the dielectric layers are fabricated by making a slurry, which is obtained by mixing a mixed powder of for example alumina and glass with an organic binder, a solvent and so forth, into sheets with a film formation apparatus and are capable of being subjected to so-called low-temperature firing, that is, at a temperature of around 1000° C., for example. In order to form the dielectric layers, via conductors that provide connections between the layers are provided preferably by forming, by, for example laser processing, via holes in the ceramic green sheets, which have been cut into a predetermined shape, filling the formed via holes with a conductive paste including, for example, Ag or Cu, or performing via fill plating, and various electrode patterns are formed by printing a conductive paste.

The internal wiring pattern 5 is defined by electrode patterns and via conductors provided on and in the dielectric layers, the electrode patterns and the via conductors being arranged to electrically connect the splitter 10 and the various components 3, which are mounted in the circuit module 1, to the mounting electrodes 6. Circuit elements such as capacitors and coils are defined by the electrode patterns and via conductors that define the internal wiring pattern 5 and a filter circuit and a matching circuit and so forth may be defined by the circuit elements such as capacitors and coils defined by the electrode patterns and via conductors.

The splitter 10 is used to separate transmission signals and reception signals having different frequencies from each other. As illustrated in FIG. 2, the splitter 10 includes a transmission filter 11 and a reception filter 12, which have different pass bands for a high-frequency signal. The transmission filter 11 and the reception filter 12 are each defined by a surface acoustic wave (SAW) filter device.

In addition, the splitter 10 includes a transmission terminal 13 that allows input to the transmission filter 11, a reception terminal 14 that allows output from the reception filter 12, a common terminal 15 (antenna terminal) that is connected to the output side of the transmission filter 11 and the input side of the reception filter 12, and a ground terminal 16, and the splitter 10 is connected to a transmission electrode 21, a reception electrode 22, a common electrode 23 and a ground electrode 24 provided in the mounting substrate 2.

In this preferred embodiment, the transmission filter 11 and the reception filter 12 of the splitter 10 are preferably defined by SAW filter devices, but, instead of SAW filter devices, the transmission filter 11 and the reception filter 12 may be defined by connecting, for example, a plurality of resonators and coils together or the transmission filter 11 and the reception filter 12 may have any kind of configuration provided that a transmission signal and a reception signal having different frequencies are separated with certainty. In addition, it is sufficient that a typical apparatus that includes the transmission filter 11 and the reception filter 12 be adopted as the splitter 10 and since the structure and operation of such an apparatus are widely known, detailed description of the structure and operation of the splitter 10 is omitted.

Next, with reference to FIG. 3, examples of the shapes of the transmission electrode 21, the reception electrode 22, the common electrode 23 and the ground electrode 24 provided in the mounting substrate 2 will be described.

In this preferred embodiment, the transmission electrode 21 (signal electrode), the reception electrode 22 (signal electrode) and the common electrode 23 (signal electrode) preferably have rectangular or substantially rectangular land shapes on a certain inner layer surface of the plurality of dielectric layers defining the mounting substrate 2. In addition, the ground electrode 24 may be, for example, provided on the surface of a dielectric layer one layer below the dielectric layer including the mounting surface 2a and the ground electrode is arranged between the transmission electrode 21 and the reception electrode 22 when viewed in plan.

FIG. 3 is a partial view of electrodes arranged in the area in the vicinity of directly below the splitter 10 and there may be other wiring electrodes in the area around these electrodes.

In this preferred embodiment, the ground electrode 24 has a shape in which a rectangular or substantially rectangular cut-out portion is provided at three places along its rectangular or substantially rectangular shape and the transmission electrode 21, the reception electrode 22 and the common electrode 23 are arranged in the three rectangular or substantially rectangular cut-out portions provided in the ground electrode 24 when viewed in plan.

In addition, a plurality of via conductors 25, which are connected to the ground electrode 24, are provided in the mounting substrate 2 and each of the via conductors 25 is arranged so that an edge 24a of the ground electrode 24 is superposed with at least a portion of an end surface of the via conductor 25 on the side connected to the ground electrode 24 when viewed in plan. That is, in this preferred embodiment, land-shaped connection portions, which extend in a tongue-shaped configuration from the edge 24a when viewed in plan, are arranged at positions along the edge 24a of the ground electrode 24 to which the via conductors 25 are connected, and each of the via conductors 25 is connected to a land-shaped connection portion such that its end surface is superposed with the edge 24a.

In addition, the ground electrode 24 is connected to the mounting electrodes 6, which are connected to the ground line GND of the motherboard MB, as a result of the plurality of via conductors 25 of the internal wiring pattern 5 being connected thereto. In this preferred embodiment, the plurality of via conductors 25 are connected along the edge 24a of the ground electrode 24 at a uniform or substantially uniform pitch when viewed in plan.

In order to ensure that a transmission signal, which has been output from the transmission electrode 21 to the transmission terminal 13 of the splitter 10, does not travel around toward the reception electrode 22 side via the ground electrode 24, in particular, an end surface of each via conductor 25 preferably is connected to an edge portion (edge 24a) of the ground electrode 24 close to the transmission electrode 21 when viewed in plan and, further, end surfaces of the plurality of via conductors 25 preferably are connected along edge portions of the ground electrode 24 from an edge portion of the ground electrode 24 close to the transmission electrode 21 up to an edge portion of the ground electrode 24 close to the reception electrode 22 when viewed in plan.

Figure 5:
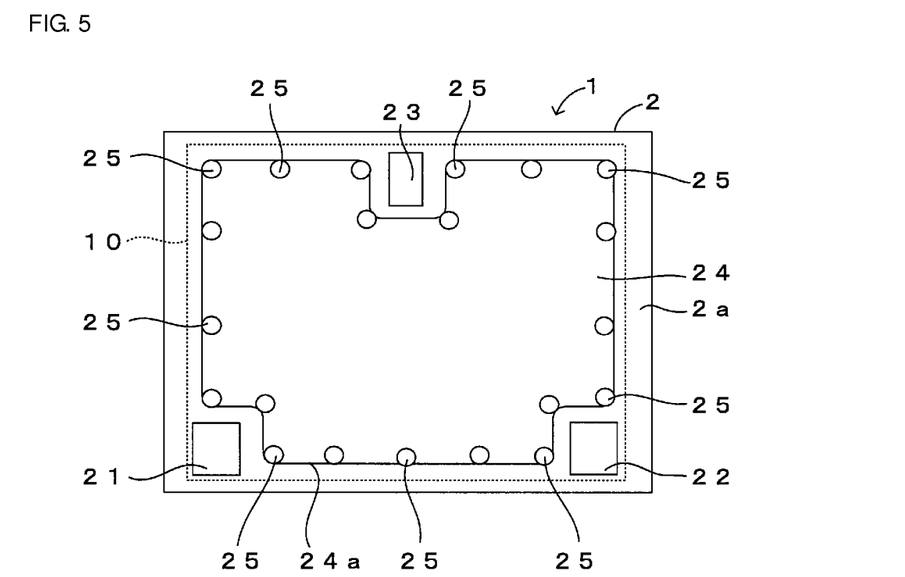
FIG. 5 is a plan view illustrating an example of the shapes of electrodes of a mounting substrate in a second preferred embodiment of a circuit module of the present invention.
Figure 7:
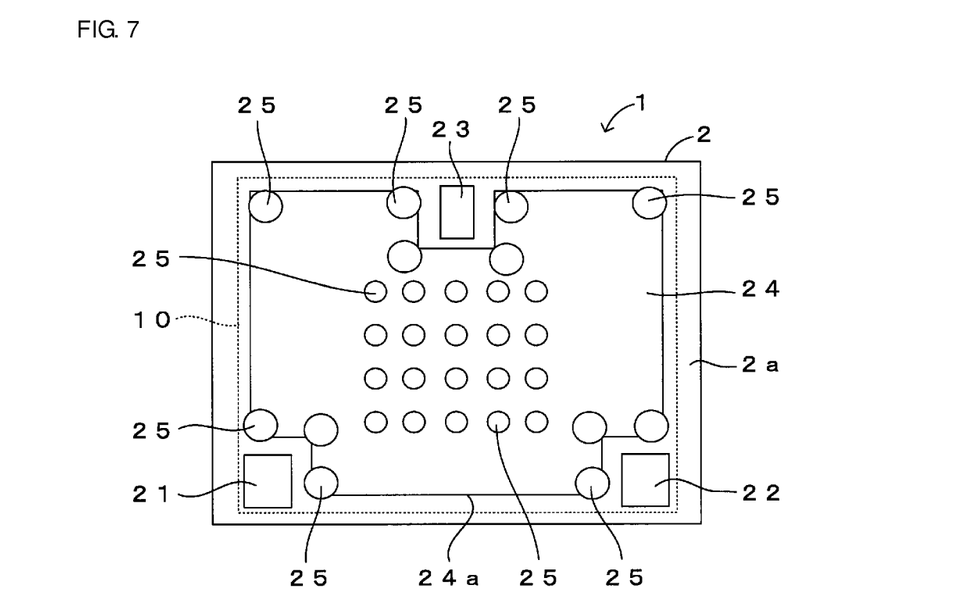
FIG. 7 is a plan view illustrating an example of the shapes of electrodes of a mounting substrate in a third preferred embodiment of a circuit module of the present invention.
Figure 8:
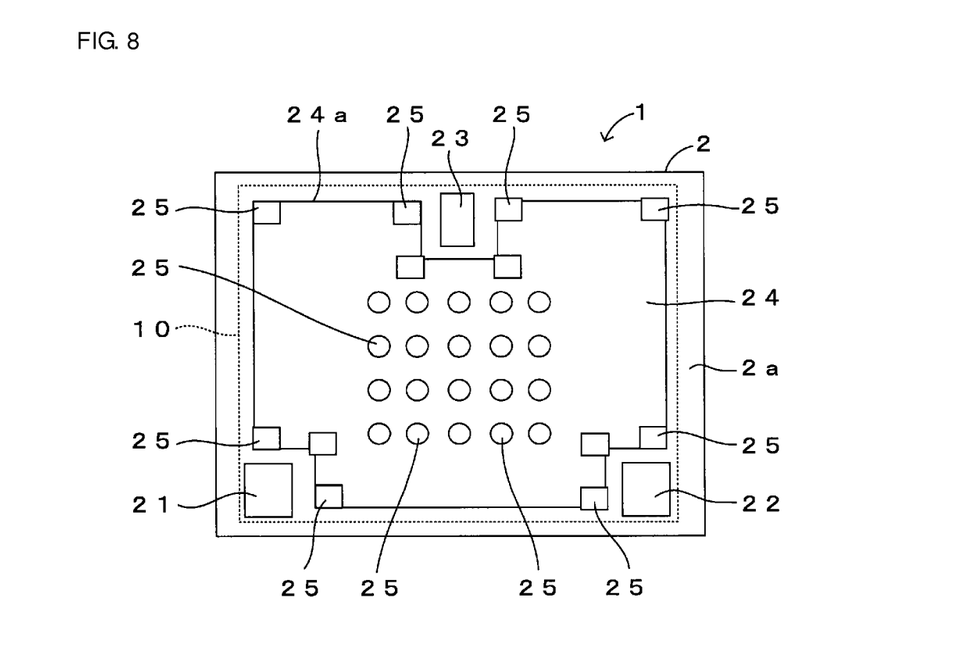
FIG. 8 is a plan view illustrating an example of the shapes of electrodes of a mounting substrate in a fourth preferred embodiment of a circuit module of the present invention.

In FIG. 3, for ease of description, only the transmission electrode 21, the reception electrode 22, the common electrode 23, the ground electrode 24, and the via conductors 25 connected to the ground electrode 24 are illustrated and illustration of other electrodes and via conductors is omitted. In addition, in FIG. 3, the ground electrode 24 and the via conductors 25 provided inside the mounting substrate 2 are illustrated with solid lines, and the mounting position of the splitter 10 on the mounting surface 2a is illustrated with a broken line in the same figure. In addition, the ground terminal 16 of the splitter 10 is connected to the ground electrode 24 via a mounting electrode provided on the mounting surface 2a and a via conductor connected to that electrode (not illustrated). FIGS. 5, 7 and 8 used in description given below show similar illustrations to FIG. 3 and therefore description thereof is omitted hereafter.

Next, an outline of a non-limiting example of a method of manufacturing the circuit module 1 of FIG. 1 will be described.

First, ceramic green sheets that define the dielectric layers constituting the mounting substrate 2 are prepared, the ceramic green sheets being formed by forming the via conductors 25 that provide connections between layers by forming via holes using, for example, a laser in the ceramic green sheets that have been formed in a predetermined shape, then filling the insides of the via holes with a conductive paste or performing via fill plating, and by then printing electrode patterns such as the transmission electrode 21, the reception electrode 22, the common electrode 23 and the ground electrode 24 using a conductive paste. The via conductors 25 and the electrode patterns such as the transmission electrode 21, the reception electrode 22, the common electrode 23 and the ground electrode 24 are provided on the ceramic green sheets in a plurality in order to make it possible to form a large number of mounting substrates 2 in one step.

Next, the dielectric layers are stacked on top of one another to form a multilayer body. Grooves, which will be used to divide the multilayer body into individual mounting substrates 2 after firing, are formed so as to enclose regions corresponding to the individual mounting substrates 2. Next, an agglomeration of mounting substrates 2 is formed by subjecting the multilayer body to low-temperature firing while applying pressure to the multilayer body.

Next, prior to dividing the multilayer body into individual mounting substrates 2, an agglomeration of circuit modules 1 is formed by mounting splitters 10 and components 3 on the mounting surfaces 2a of the agglomeration of the mounting substrates 2 and providing a molded layer (not illustrated) on each of the mounting substrates 2 by covering the mounting surfaces 2a of the agglomeration of the mounting substrates 2 on which the splitters 10 and the components 3 are mounted with molding resin and thermally curing the molding resin. The circuit modules 1 are completed by dividing the agglomeration of circuit modules 1 into individual pieces.

In the thus-formed circuit module 1, a transmission signal output from the transmission signal line Tx of the motherboard MB to the transmission terminal 13 of the splitter 10 via a mounting electrode 6 and the internal wiring pattern 5 is input to the transmission filter 11 and subjected to predetermined filter processing, output to the mounting substrate side from the common terminal 15, and output to the antenna line ANT of the motherboard MB via the internal wiring pattern 5 (matching circuit) and a mounting electrode 6. In addition, a reception signal that is input to the common terminal 15 of the splitter 10 from the antenna line ANT of the motherboard MB via a mounting electrode 6 and the internal wiring pattern 5 (matching circuit) is input to the reception filter 12 and subjected to predetermined filter processing, output to the mounting substrate side from the reception terminal 14 and is output to the reception signal line Rx of the motherboard MB via the internal wiring pattern 5 and a mounting electrode 6.

The circuit module 1, which includes the mounting substrate 2, in which the internal wiring pattern 5 is provided, the splitter 10, the components 3 and the molded layer, is not limited to being manufactured by the above-described method and may be formed by any general widely known method, and the mounting substrate 2 can be a printed board, an LTCC substrate, an alumina-based substrate, a glass substrate, a composite material substrate, a single-layer substrate, a multilayer substrate and so on using, for example, a resin, a ceramic or a polymer material, and the mounting substrate 2 may be formed by choosing the most appropriate material in accordance with the intended use of the circuit module 1.

In addition, in this preferred embodiment, a matching circuit is defined by the internal wiring pattern 5, but a matching circuit may instead be defined by a component 3 such as a chip coil mounted on the mounting surface 2a of the mounting substrate 2.

Next, with reference to FIG. 4, characteristics of isolation of the transmission electrode 21 and the reception electrode 22 of the circuit module 1, in which the ground electrode 24 illustrated in FIG. 3 is provided in the mounting substrate 2, from each other will be described.

FIG. 4 illustrates an example of the isolation characteristics of the circuit module 1 equipped with the mounting substrate 2 of FIG. 3, where the vertical axis represents gain (dB) and the horizontal axis represents frequency (GHz), and the magnitude of a signal detected at the reception electrode 22 is illustrated when a high-frequency signal at various frequencies is output to the transmission terminal 13 of the splitter 10 from the transmission electrode 21. Curve A in the same figure represents isolation characteristics achieved with a configuration of the related art in which the plurality of via conductors 25 are arranged with respect to the ground electrode 24 such that end surfaces of the via conductors 25 are not superposed with the edge 24a of the ground electrode 24 when viewed in plan. Curve B in the same figure represents isolation characteristics achieved with the configuration illustrated in the above-mentioned FIG. 3.

In addition, the frequency band indicated by arrow Tbf in FIG. 4 represents a high-frequency signal passband of the transmission filter 11 and the frequency band indicated by arrow Rbf in the same figure represents a high-frequency signal passband of the reception filter 12. Therefore, theoretically, so long as high-frequency signals of the frequency bands indicated by the arrows Tbf and Rbf among high-frequency signals output from the transmission electrode 21 to the transmission terminal 13 of the splitter 10 do not directly travel around to the reception electrode 22 via the ground electrode 24, there is no danger of these signals being detected at the reception electrode 22, and therefore it is necessary that high-frequency signals of those frequency bands not be detected at the reception electrode 22 (gain is low) so that a transmission signal and a reception signal input to and output from the splitter 10 do not interfere with each other.

As illustrated in FIG. 4, the gain of high-frequency signals of the frequency bands indicated by the arrows Tbf and Rbf detected at the reception electrode 22 achieved with the configuration of FIG. 3 represented by the curve B is lower than the gain achieved with the configuration of the related art represented by the curve A. Therefore, the isolation characteristics of the circuit module 1 including the mounting substrate 2 illustrated in FIG. 3 are improved from the isolation characteristics of the configuration of the related art.

As described above, according to this preferred embodiment, the splitter 10 includes the transmission terminal 13 that allows input to the transmission filter 11, the reception terminal 14 that allows output from the reception filter 12, and the ground terminal 16, and the mounting substrate 2 on which the splitter 10 is mounted is provided with the transmission electrode 21 that is connected to the transmission terminal 13 of the splitter 10 and the reception electrode 22 that is connected to the reception terminal 14 of the splitter 10 as signal electrodes, and the ground electrode 24 that is connected to the ground terminal 16 of the splitter 10 is arranged between the transmission electrode 21 and the reception electrode 22 when viewed in plan, and the plurality of via conductors 25 are arranged along the ground electrode 24 so that end surfaces thereof are superposed with the edge 24a of the ground electrode 24 when viewed in plan.

Therefore, even if a transmission signal output from the transmission electrode 21 of the mounting substrate 2 to the transmission terminal 13 of the splitter 10 leaks into the ground electrode 24, the transmission signal that has leaked into the ground electrode 24 is mainly transmitted along the edge 24a of the ground electrode 24 and therefore the transmission signal that has leaked into the ground electrode 24 readily flows into the plurality of via conductors 25 arranged so that their end surfaces are superposed with the edge 24a of the ground electrode 24 when viewed in plan. Therefore, a transmission signal that has been output from the transmission electrode 21 and leaked into the ground electrode 24 is prevented from traveling along the edge 24a of the ground electrode 24 toward the reception electrode 22 side and as a result, characteristics of isolation of the transmission electrode 21 and the reception electrode 22, which are provided in the mounting substrate 2 on which the splitter 10 is mounted, from each other are improved.

In addition, since the edge 24a of the ground electrode 24 includes bent portions, that is, the edge 24a is provided with bends, the ground electrode 24 has an optimal shape between the plurality of signal electrodes (transmission electrode 21, reception electrode 22 and common electrode 23) provided in the mounting substrate 2, which is practical.

In addition, in the configuration of the related art, a large number of via conductors 25 have to be arranged at positions at which their end surfaces are not superposed with the edge 24a of the ground electrode 24 when viewed in plan such as in a central portion of the ground electrode 24 when viewed in plan in order to improve the characteristics of isolation of the transmission electrode 21 and the reception electrode 22 from each other and an increase in the manufacturing cost is incurred. In contrast, with the above-described configuration, the plurality of via conductors 25 are arranged so that their end surfaces are superposed with the edge 24a of the ground electrode when viewed in plan where a transmission signal that has leaked into the ground electrode 24 from the transmission electrode 21 is concentrated and as a result it is possible to efficiently make a transmission signal that has leaked into the ground electrode 24 flow into the ground line GND of the motherboard MB with a smaller number of via conductors 25 than in the configuration of the related art. Therefore, the number of via conductors 25 is reduced and a reduction in manufacturing cost is achieved.

Second Preferred Embodiment

Figure 6:
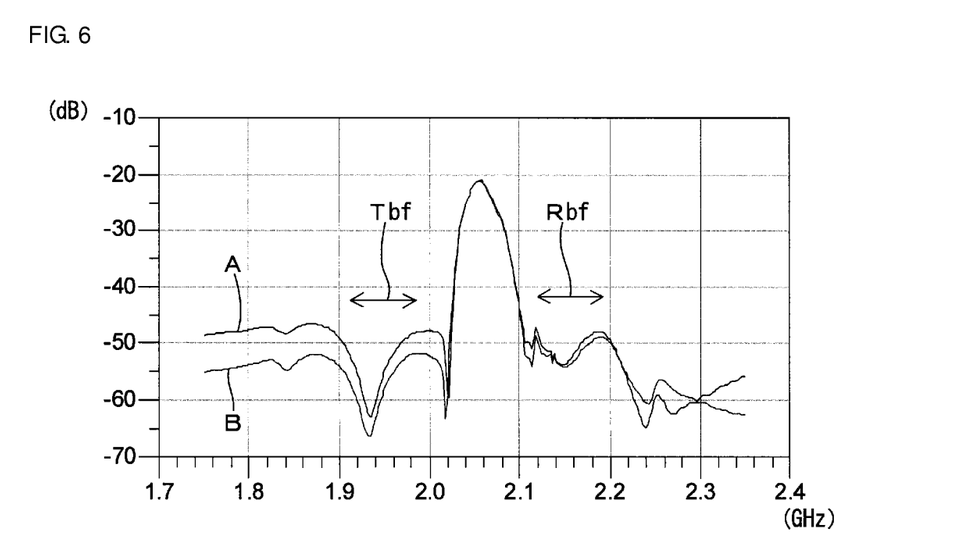
FIG. 6 illustrates an example of isolation characteristics for the mounting substrate of FIG. 5.

Next, a second preferred embodiment of the present invention will be described with reference to FIG. 5 and FIG. 6. FIG. 5 is a plan view illustrating an example of the shapes of electrodes of a mounting substrate in a second preferred embodiment of a circuit module of the present invention. FIG. 6 illustrates an example of isolation characteristics for the mounting substrate of FIG. 5. This preferred embodiment differs from the above-described first preferred embodiment in that, as illustrated in FIG. 5, bent portions of the edge 24a of the ground electrode 24 preferably have a circular or substantially circular arc shape and a portion of the end surface of each via conductor 25 arranged at a bent portion preferably has the same shape as a portion of the bent portion, that is, a circular or substantially circular arc shape. The rest of the configuration is preferably the same or substantially the same as in the first preferred embodiment described above and therefore the same symbols are used so that description of the rest of the configuration may be omitted. In addition, since description of FIG. 6 would be similar to that of FIG. 4, the same symbols are used so that detailed description of the FIG. 6 may be omitted.

With this configuration, as illustrated in FIG. 6, the gain of high-frequency signals of the frequency bands indicated by the arrows Tbf and Rbf detected at the reception electrode 22 achieved with the configuration of FIG. 5 represented by the curve B is lower than the gain achieved with the configuration of the related art represented by the curve A. Therefore, the isolation characteristics of the circuit module 1 equipped with the mounting substrate 2 illustrated in FIG. 5 are improved from the isolation characteristics of the configuration of the related art and the same effect as in the above-described first preferred embodiment is achieved.

That is, according to this preferred embodiment, a transmission signal that has leaked into the ground electrode 24 from the transmission electrode 21 provided in the mounting substrate 2 is concentrated around the bent portions of the edge 24a of the ground electrode 24 and since a portion of the end surface of each via conductor 25 arranged at such a bent portion has the same shape as a portion of the bent portion and the via conductor 25 is arranged such that the same-shaped portions of the end surface of the via conductor 25 and the bent portion of the edge 24a are aligned, the area of contact between the ground electrode 24 and the end surface of the via conductor 25 at the bent portion is increased.

Therefore, since a transmission signal that has leaked into the ground electrode 24 from the transmission electrode 21 and become concentrated in the bent portions of the ground electrode 24 readily and efficiently flows into the via conductors 25 whose end surfaces are arranged at the bent portions, the transmission signal that has leaked into the ground electrode 24 from the transmission electrode 21 is more efficiently prevented from traveling along the edge 24a of the ground electrode 24 toward the reception electrode 22. Therefore, the characteristics of isolation of the transmission electrode 21 and the reception electrode 22, which are provided in the mounting substrate 2, from each other are further improved.

In addition, since the bent portions of the edge 24a of the ground electrode 24 preferably have a circular or substantially circular arc shape, concentration of a signal, which has leaked into the ground electrode 24 from the transmission electrode 21, in the bent portions of the edge 24a of the ground electrode 24 are reduced. In addition, traveling of a transmission signal that has leaked into the ground electrode 24 from the transmission electrode 21 along the edge 24a of the ground electrode 24 toward the reception electrode 22 is prevented or significantly reduced by the bent portions of the edge 24a of the ground electrode 24, which preferably have a circular or substantially circular arc shape.

Third Preferred Embodiment

Next, a third preferred embodiment of the present invention will be described with reference to FIG. 7. FIG. 7 is a plan view illustrating an example of the shapes of electrodes of a mounting substrate in a third preferred embodiment of a circuit module of the present invention. This preferred embodiment differs from the above-described first preferred embodiment in that, as illustrated in FIG. 7, a plurality of via conductors 25 are additionally arranged at positions other than along the edge 24a of the ground electrode 24, that is, in a portion substantially in the center of the ground electrode 24 when viewed in plan, and the diameter of each via conductor 25 arranged so that its end surface is superposed with the edge 24a of the ground electrode 24 is preferably larger than the diameter of each via conductor 25 arranged at a position other than along the edge 24a of the ground electrode 24. In addition, the ground electrode 24 preferably has a configuration in which rectangular or substantially rectangular cut-out portions are provided at three places along the rectangular or substantially rectangular shape thereof and the bent portions of the edge 24a are arranged to define right angles. The rest of the configuration is preferably the same or substantially the same as in the first preferred embodiment described above and therefore the same symbols are used so that description of the rest of the configuration may be omitted.

With this configuration, a plurality of via conductors 25 are additionally arranged in a portion of the ground electrode 24 substantially in the center when viewed in plan other than along the edge 24a of the ground electrode 24, and, further, the diameter of each via conductor 25 arranged so that its end surface is superposed with the edge 24a of the ground electrode 24 is preferably larger than the diameter of each via conductor 25 arranged at a position other than along the edge 24a of the ground electrode 24.

Therefore, when a transmission signal leaks from the transmission electrode 21 of the mounting substrate 2 into the ground electrode 24, the greater portion of the transmission signal that has leaked into the ground electrode 24 is transmitted along the edge 24a of the ground electrode 24, but since the diameter of each via conductor 25 arranged so that its end surface is superposed with the edge 24a of the ground electrode 24 is large, the transmission signal that has leaked from the transmission electrode 21 into the ground electrode 24 readily flows into the large diameter via conductors 25 and the leaked transmission signal is prevented from traveling along the edge 24a of the ground electrode 24 toward the reception electrode 22 and the same effect as in the above-described first preferred embodiment is achieved.

In addition, the same effect is achieved by making the diameter of each via conductor 25 arranged at a bent portion of the edge 24a of the ground electrode 24 larger than the diameter of other via conductors 25 in places other than the bent portions including the via conductors 25 arranged such that their end surfaces are superposed with the edge 24a.

That is, a transmission signal that has leaked from the transmission electrode 21 provided in the mounting substrate 2 into the ground electrode 24 is concentrated in the bent portions of the edge 24a of the ground electrode 24, but since the via conductors 25 arranged at the bent portions have a diameter that is larger than the diameter of the other via conductors 25 arranged at places other than the bent portions, the area of contact between the ground electrode 24 and the end surfaces of the via conductors 25 at the bent portions is increased and since the diameter of those via conductors 25 is larger, the electrical resistance of the via conductors 25 is reduced and a leaked transmission signal that is concentrated in the bent portions readily flows into the via conductors 25.

Therefore, a transmission signal that has leaked into the ground electrode 24 from the transmission electrode 21 and is concentrated in the bent portions efficiently flows into the via conductors 25 arranged at the bent portions and as a result, the transmission signal that has leaked into the ground electrode 24 is more efficiently prevented from traveling along the edge 24a of the ground electrode 24 toward the reception electrode 22. Therefore, the characteristics of isolation of the plurality of signal electrodes (transmission electrode 21, reception electrode 22 and common electrode 23), which are provided in the mounting substrate 2, from each other are further improved.

Fourth Preferred Embodiment

Next, a fourth preferred embodiment of the present invention will be described with reference to FIG. 8. FIG. 8 is a plan view illustrating an example of the shapes of electrodes of a mounting substrate in a fourth preferred embodiment of a circuit module of the present invention. This preferred embodiment differs from the above-described third preferred embodiment in that, as illustrated in FIG. 8, the via conductors arranged at the bent portions of the ground electrode 24 preferably have a square or substantially square pillar shape and as a result, a portion of the end surface of each via conductor 25 arranged at a bent portion preferably has the same shape as a portion of the bent portion. The rest of the configuration is preferably the same or substantially the same as in the third preferred embodiment described above and therefore the same symbols are used so that description of the rest of the configuration may be omitted.

With this configuration, the via conductors 25 are each arranged such that the same-shaped portions of the end surface of the via conductor 25 and the corresponding bent portion of the edge 24a are aligned, such that the area of contact between the ground electrode 24 and the via conductor 25 at the bent portion is increased. Therefore, a transmission signal that has leaked from the transmission electrode 21 into the ground electrode 24 and is concentrated in the bent portions of the ground electrode 24 efficiently and readily flows into the via conductors 25 whose end surfaces are arranged at the bent portions and therefore, the same effect as in the above-described third preferred embodiment is achieved.

In addition, the present invention is not limited to the above-described preferred embodiments and various modifications not described above can be made so long as they do not deviate from the gist of the present invention and the configurations of the above-described preferred embodiments may be combined. For example, the ground electrode 24 may be provided in layers in the mounting substrate 2 and the layers of the ground electrode 24 may be electrically connected to one another with a plurality of via conductors 25.

With this configuration, since the individual portions of the ground electrode 24, which is arranged across a plurality of layers in the mounting substrate 2, are connected to each other with the via conductors 25, a transmission signal that has been output from the transmission electrode 21 and leaked into the ground electrode 24 more efficiently readily flows into the plurality of via conductors 25 arranged so that their end surfaces are superposed with the edge 24a of the ground electrode 24 when viewed in plan and therefore, a transmission signal that has leaked into the ground electrode 24 is more efficiently prevented from traveling along the edge 24a of the ground electrode 24 toward the reception electrode 22 side. Thus, the characteristics of isolation of the transmission electrode 21 and the reception electrode 22, which are provided in the mounting substrate 2 on which the splitter 10 is mounted, from each other are even more improved.

In addition, the individual portions of the ground electrode 24 arranged across a plurality of layers in the mounting substrate 2 may have the same shape, but a transmission signal that has been output from the transmission electrode 21 and leaked into the ground electrode 24 is efficiently guided into the plurality of via conductors 25 whose end surfaces are superposed with the edge 24a of the ground electrode 24 if at least the portions of the ground electrode 24 that are close to the transmission electrode 21 have the same shape when viewed in plan.

In addition, it is sufficient that the plurality of via conductors 25 be at least arranged along a portion of the edge 24a of the ground electrode 24 close to the transmission electrode 21 when viewed in plan, and the ground electrode 24 may be provided on the mounting surface 2a of the mounting substrate 2 or the ground electrode 24 may be provided on a lower layer in the mounting substrate 2.

In addition, the shapes of the transmission electrode 21, the reception electrode 22 and the common electrode 23 provided on the mounting surface 2a of the mounting substrate 2 are not limited to rectangular or substantially rectangular shapes, and may have any shape such as a circular or substantially circular shape so long as the splitter 10 can be mounted thereon, and the ground electrode 24 need not necessarily have a shape that surrounds the rectangular or substantially rectangular transmission electrode 21, the reception electrode 22 and the common electrode 23 when viewed in plan. In addition, the shape of the ground electrode 24 when viewed in plan may be any shape provided that the ground electrode 24 is arranged between the transmission electrode 21, the reception electrode 22 and the common electrode 23, that is, between a plurality of signal electrodes.

In addition the signal electrodes are not limited to being the electrodes 21 to 23 that provide connections to the terminals 13 to 15 of the above-described splitter 10.

In addition, the peripheral portion of each via conductor 25 may be arranged so as to protrude toward the edge of the mounting substrate 2 from the edge 24a of the ground electrode 24. Since a current that has leaked into the ground electrode is concentrated around the edge of the ground electrode, the characteristics of isolation of the transmission electrode 21 and the reception electrode 22 from each other are further improved by arranging the via conductors close to the edge of the mounting substrate 2. In addition, since the size of the ground electrode preferably is increased by an amount by which a peripheral portion of each via conductor 25 protrudes toward the outside from the edge 24a of the ground electrode 24, the size of the ground electrode is increased.

Various preferred embodiments of the present invention can be widely applied to circuit modules that include a mounting substrate that is provided with a plurality of signal electrodes for various components and circuit patterns, a ground electrode arranged between the signal electrodes when viewed in plan, and a plurality of via conductors connected to the ground electrode.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit module comprising:
a mounting substrate including a plurality of signal electrodes, a ground electrode that is arranged between the signal electrodes when viewed in plan and isolated from the signal electrodes, and a plurality of first and second via conductors that are connected to the ground electrode; wherein
each of the plurality of first via conductors is arranged so that an edge of the ground electrode is superposed with at least a portion of an end surface of the via conductor when viewed in plan;
the plurality of second via conductors are arranged in a portion substantially in the center of the ground electrode when viewed in plan;
at least one of the plurality of first via conductors arranged so that its end surface is superposed with the edge of the ground electrode has an area that is larger than an area of at least one of the plurality of second via conductors arranged in the portion substantially in the center of the ground electrode when viewed in plan; and
all of the plurality of signal electrodes and all of the plurality of first and second via conductors are spaced away from edges of the mounting substrate.

2. The circuit module according to claim 1, wherein the edge of the ground electrode includes a bent portion.

3. The circuit module according to claim 2, wherein a portion of an end surface of a via conductor arranged at the bent portion of the edge of the ground electrode has a same shape as a portion of the bent portion.

4. The circuit module according to claim 2, wherein the bent portion of the edge of the ground electrode has a circular or substantially circular arc shape.

5. The circuit module according to claim 3, wherein the via conductor arranged at the bent portion of the edge of the ground electrode has a diameter larger than that of another via conductor arranged at a location other than the bent portion.

6. The circuit module according to claim 1, wherein
the at least one of the plurality of first via conductors arranged so that its end surface is superposed with the edge of the ground electrode has a diameter that is larger than a diameter of the at least one of the plurality of second via conductors arranged in the portion substantially in the center of the ground electrode.

7. The circuit module according to claim 1, wherein
a splitter including a transmission filter and a reception filter having different pass bands is mounted on the mounting substrate;
the splitter includes a transmission terminal that allows input to the transmission filter, a reception terminal that allows output from the reception filter, and a ground terminal;
a transmission electrode that is connected to the transmission terminal and a reception electrode that is connected to the reception terminal are provided as the signal electrodes in the mounting substrate; and
the ground electrode is arranged between the transmission electrode and the reception electrode when viewed in plan and connected to the ground terminal.

8. The circuit module according to claim 1, wherein the ground electrode is provided in layers in the mounting substrate and the layers of the ground electrode are electrically connected to each other.

9. The circuit module according to claim 7, wherein the transmission filter and the reception filter are each defined by a surface acoustic wave filter device.

10. The circuit module according to claim 7, wherein the transmission filter and the reception filter are each defined by a plurality of resonators and coils.

11. The circuit module according to claim 1, wherein the ground electrode has a shape in which a rectangular or substantially rectangular cut-out portion is provided at three places along its rectangular or substantially rectangular shape.

12. The circuit module according to claim 11, wherein a transmission electrode, a reception electrode, and a common electrode are provided as the signal electrodes in the mounting substrate and are arranged in the three rectangular or substantially rectangular cut-out portions provided in the ground electrode when viewed in plan.

13. The circuit module according to claim 1, wherein the mounting substrate is one of a printed board, an LTCC substrate, an alumina-based substrate, a glass substrate, a composite material substrate, a single-layer substrate, and a multilayer substrate.

14. The circuit module according to claim 1, further comprising a matching circuit defined by an internal wiring pattern in the mounting substrate or a chip coil mounted on a mounting surface of the mounting substrate.

15. The circuit module according to claim 12, wherein the transmission electrode, the reception electrode and the common electrode are rectangular, substantially rectangular, circular, or substantially circular.

16. The circuit module according to claim 12, wherein the ground electrode is arranged between the transmission electrode, the reception electrode and the common electrode.

17. A mobile communication terminal comprising the circuit module according to claim 1.

18. The mobile communication terminal according to claim 17, wherein the mobile communication terminal is a cellular phone or a mobile information terminal.

19. The circuit module according to claim 1, wherein the at least one of the plurality of first via conductors arranged so that its end surface is superposed with the edge of the ground electrode has a square or substantially square shape when viewed in plan.

* * * * *